United States Patent
Maruta

(10) Patent No.: US 7,924,954 B2
(45) Date of Patent: Apr. 12, 2011

(54) FREQUENCY CORRECTION

(75) Inventor: Yasushi Maruta, Tokyo (JP)

(73) Assignee: NEC Corporation, Tokyo (JP)

( * ) Notice: Subject to any disclaimer, the term of this patent is extended or adjusted under 35 U.S.C. 154(b) by 559 days.

(21) Appl. No.: 12/101,624

(22) Filed: Apr. 11, 2008

(65) Prior Publication Data

US 2008/0253486 A1    Oct. 16, 2008

(30) Foreign Application Priority Data

Apr. 12, 2007    (JP) .................................. 2007-104885

(51) Int. Cl.
*H04L 27/06*    (2006.01)

(52) U.S. Cl. ...................... 375/344; 375/371; 455/182.2; 455/192.2

(58) Field of Classification Search .................. 375/147, 375/260, 327, 340, 344, 346, 349, 371; 455/182.1, 455/182.2, 192.1, 192.2, 226.1–226.4; 329/308, 318–320, 349

See application file for complete search history.

(56) References Cited

U.S. PATENT DOCUMENTS

| | | | | |
|---|---|---|---|---|
| 5,818,882 A * | 10/1998 | Komatsu | ........................ | 375/344 |
| 6,298,227 B1 * | 10/2001 | Molnar | .......................... | 455/323 |
| 6,519,300 B1 * | 2/2003 | Ramesh | ......................... | 375/344 |
| 7,139,333 B2 * | 11/2006 | Tanada et al. | ................. | 375/316 |

FOREIGN PATENT DOCUMENTS

| | | |
|---|---|---|
| JP | 07176994 A | 7/1995 |
| JP | 2000244440 A | 9/2000 |
| JP | 2001177592 A | 6/2001 |

* cited by examiner

*Primary Examiner* — Dac V Ha

(57) ABSTRACT

A frequency correction circuit that gives plural frequency offsets to a received radio signal in order to correct a frequency error of the radio signal, demodulates the radio signal, combines an arbitrary number of demodulation signals as combined demodulation signals from among plural demodulation signals, and selects one demodulation signal or combined demodulation signal from among the demodulation signals and the combined demodulation signals.

5 Claims, 4 Drawing Sheets

FREQUENCY CORRECTION

This application is based upon and claims the benefit of priority from Japanese Patent Application No. 2007-104885 filed on Apr. 12, 2007, the content of which is incorporated by reference.

BACKGROUND OF THE INVENTION

1. Field of the Invention

The present invention relates to a frequency correction circuit and a frequency correction method in a receiver for receiving a radio signal provided in a radio base station and a mobile terminal used in a mobile communication system.

2. Description of the Related Art

In general, in a mobile communication system employing radio technology, communication between a radio base station and a mobile terminal is performed with a radio transmission channel.

As a multiple access system that the radio base station uses to simultaneously communicate with plural mobile terminals, Frequency Division Multiple Access (FDMA), Time Division Multiple Access (TDMA), Code Division Multiple Access (CDMA), and the like are put to practical use.

In such a mobile communication system, it is likely that a frequency error is present in a received signal such as a shift of fixed radio frequencies between the radio base station and the mobile terminals. In this case, usually, an operation for correcting the frequency error by AFC (Auto Frequency Control) is performed in radio signal receivers of the radio base station and the mobile terminals. The operation for correcting the frequency error by AFC is carried out by a method of demodulating a received signal and detecting a frequency error to control a frequency of a local transmitter of a reception circuit or by a method of controlling a frequency offset added to a received signal. Loop control is mainly used for these methods.

Referring to FIG. 1, an example of a general frequency correction circuit including reception antenna unit 901, radio receiver 902, frequency-offset giving units 903-1 to 903-n, demodulators 904-1 to 904-n, demodulation-signal selector 906, and frequency-offset determining unit 907 is shown.

Reception antenna unit 901 receives a radio signal transmitted between a radio base station and a mobile terminal.

Radio receiver 902 is inputted with a signal outputted from reception antenna unit 901, performs amplification, frequency conversion from a radio band to a base band, orthogonal detection, analog to digital conversion, and the like for the inputted signal, and outputs the signal subjected to these kinds of processing to frequency-offset giving units 903-1 to 903-n. In general, radio receiver 902 includes a low-noise amplifier, a band limiting filter, a mixer, a local transmitter, an AGC (Auto Gain Controller), an orthogonal detector, a low-pass filter, and an analog to digital converter.

Frequency-offset giving units 903-1 to 903-n that are inputted with the signal outputted from radio receiver 902 and a signal outputted from frequency-offset determining unit 907, give frequency offsets outputted from frequency-offset determining unit 907 to the signal outputted from radio receiver 902, and output signals to demodulators 904-1 to 904-n, respectively. Specifically, frequency-offset giving units 903-1 to 903-n apply phase rotation processing that corresponds to the frequency offset given to the signal outputted from frequency-offset determining unit 907 to respective symbols of a digital received signal in the base band, which is the signal outputted from radio receiver 902.

Demodulators 904-1 to 904-n are inputted with the signals outputted from frequency-offset giving units 903-1 to 903-n, respectively, perform separation of desired user signal components from multiplexed plural user signal components, detection and selection of timing of multi-path components of the desired user signal components, i.e., path delays, channel estimation, and the like, and calculate demodulation signals. The demodulation signals are outputted to demodulation-signal selector 906.

Demodulation-signal selector 906 selects an optimum demodulation signal out of the demodulation signals outputted from demodulators 904-1 to 904-n.

Frequency-offset determining unit 907 determines fixed frequency offsets corresponding to plural frequency errors that cover bands in which a frequency error is likely to occur and outputs the determined frequency offset to frequency-offset giving units 903-1 to 903-n.

On the other hand, concerning a communication scheme in which the operation for correcting a frequency error by AFC employing loop control is difficult such as burst communication, a method of giving fixed frequency offsets corresponding to plural frequency errors prepared in advance to a received signal and, then, performing demodulation, and selecting an optimum signal out of the demodulation signals is disclosed in JP1995-176994A.

However, in the related art described above, in order to accurately correct a frequency error of a received signal and prevent deterioration at the time of demodulation, intervals of fixed frequency offsets corresponding to frequency errors have to be set sufficiently small to cover bands in which it is likely that a frequency error occurs.

When the intervals of the fixed frequency offsets corresponding to the frequency errors are set sufficiently small to over bands in which it is likely that an error occurs, it is necessary to prepare frequency-offset giving units and demodulators in a number of the fixed frequency offsets corresponding to the frequency errors. Therefore, the circuit size increases.

SUMMARY OF THE INVENTION

It is an object of the present invention to provide a frequency correction circuit and a frequency correction method that can accurately correct a frequency error of a received signal and prevent deterioration at the time of demodulation while controlling an increase in the circuit size.

In order to attain the object, the present invention provides a frequency correction circuit that gives plural frequency offsets to a received radio signal in order to correct a frequency error of the radio signal, demodulates the radio signal, and selects one demodulation signal from among demodulated plural demodulation signals. The frequency correction circuit combines an arbitrary number of demodulation signals as combined demodulation signals from among the plural demodulation signals and selects one demodulation signal or combined demodulation signal from among the demodulation signals and the combined demodulation signals.

The present invention also provides a frequency correction method for correcting a frequency error of a received radio signal. The frequency correction method includes a step of determining plural frequency offsets given to the radio signal, a step of giving the determined frequency offsets to the radio signal, a step of demodulating the radio signal to which the frequency offsets are given, a step of combining an arbitrary number of demodulation signals as combined demodulation signals from among demodulated demodulation signals, and a step of selecting one demodulation signal or combined demodulation signal from among the demodulation signals and the combined demodulation signals.

As explained above, in the present invention, in order to correct a frequency error of a received radio signal, plural frequency offsets given to the radio signal are determined, the determined frequency offsets are given to the radio signal, the radio signal to which the frequency offsets are given is demodulated, an arbitrary number of demodulation signals are combined as combined demodulation signals from among demodulated demodulation signals, and one demodulation signal or combined demodulation signal is selected from among the demodulation signals and the combined demodulation signals. Therefore, it is possible to accurately correct a frequency error of a received signal and prevent deterioration at the time of demodulation while controlling an increase in a circuit size.

The above and other objects, features, and advantages of the present invention will become apparent from the following description with reference to the accompanying drawings which illustrate an example of the present invention.

EXEMPLARY EMBODIMENT

Figure 1:
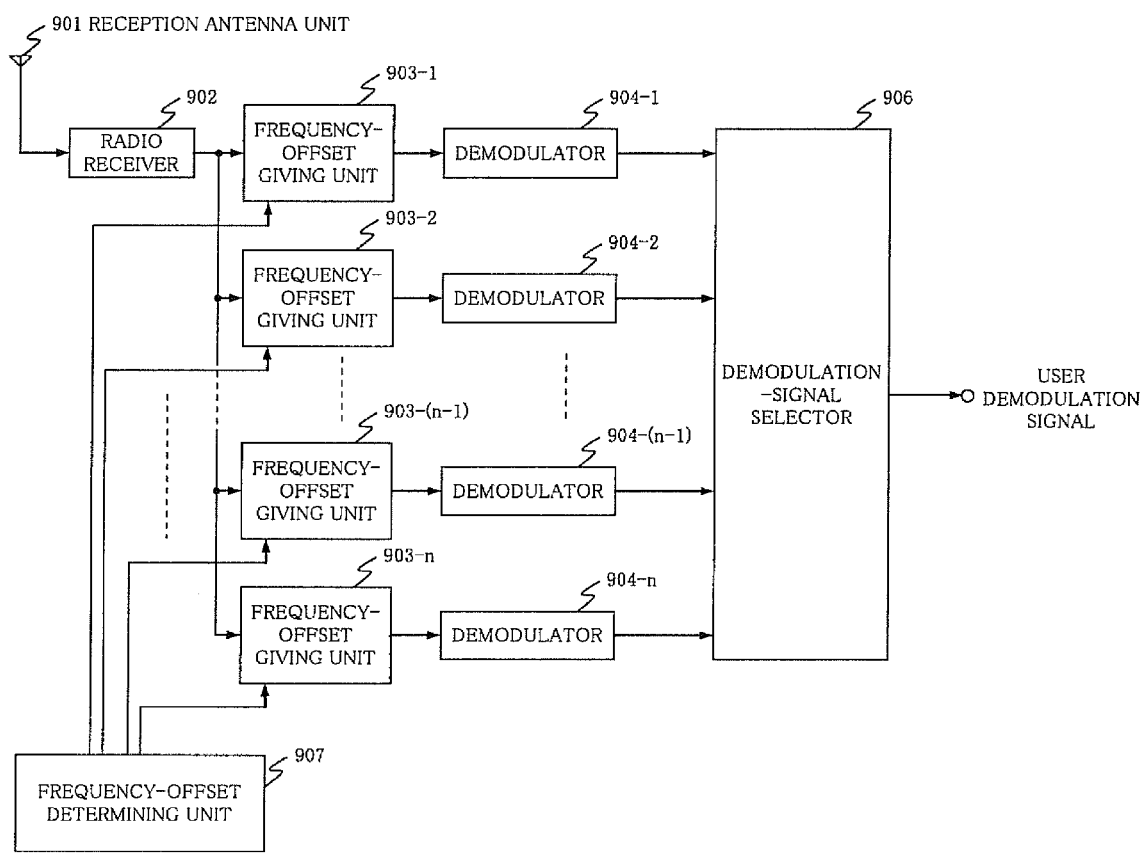
FIG. 1 is a diagram showing an example of a general frequency correction circuit.
Figure 2:
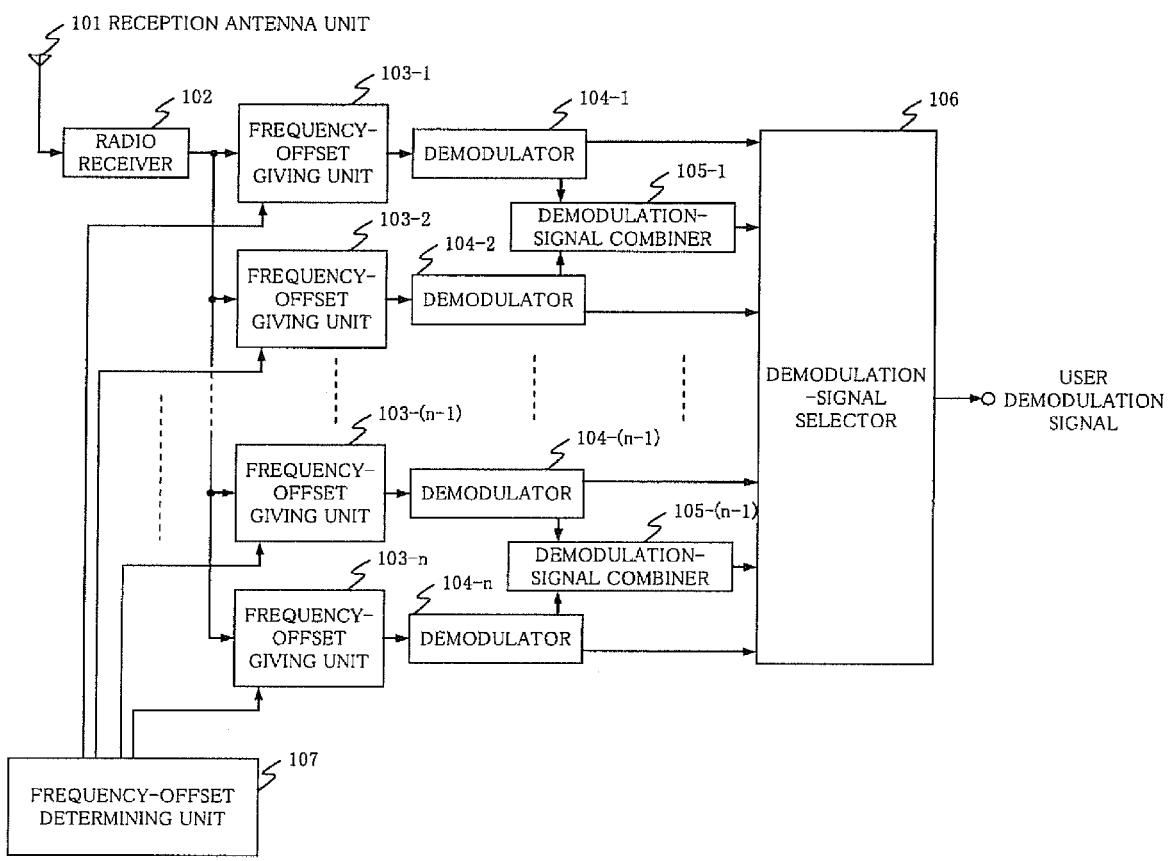
FIG. 2 is a diagram showing a frequency correction circuit according to an exemplary embodiment of the present invention.

Referring to FIG. 2, a frequency correction circuit according to an exemplary embodiment of the present invention including reception antenna unit 101, radio receiver 102, frequency-offset giving units 103-1 to 103-n, demodulators 104-1 to 104-n, demodulation-signal combiners 105-1 to 105-(n−1), demodulation-signal selector 106, and frequency-offset determining unit 107 is shown. The frequency correction circuit can be provided in a radio base station and a mobile terminal. In the following explanation, the frequency correction circuit is provided in the radio base station as an example.

Reception antenna unit 101 receives a radio signal transmitted between the radio base station and the mobile terminal. The number and an arrangement of reception antenna elements in reception antenna unit 101 are not specifically limited. In the signal received by reception antenna unit 101, user signal components transmitted from respective mobile terminals with plural radio transmission channels, interference signal components, and thermal noise are superimposed. Since the user signal components are transmitted with the plural radio transmission channels, there are multi-path components that have with different delays in identical user signal components.

Radio receiver 102 is inputted with a signal outputted from reception antenna unit 101, performs amplification, frequency conversion from a radio band to a base band, orthogonal detection, analog to digital conversion, and the like for the inputted signal, and outputs the signal subjected to these kinds of processing to frequency-offset giving units 103-1 to 103-n. In general, radio receiver 102 includes a low-noise amplifier, a band limiting filter, a mixer, a local transmitter, an AGC (Auto Gain Controller), an orthogonal detector, a low-pass filter, and an analog to digital converter. These components are the same as those in the past and are not specifically limited.

Frequency-offset giving units 103-1 to 103-n are inputted with the signal outputted from radio receiver 102 and a signal outputted from frequency-offset determining unit 107, give frequency offsets outputted from frequency-offset determining unit 107 to the signal outputted from radio receiver 102, and output signals to demodulators 104-1 to 104-n, respectively. The number of frequency offsets outputted from frequency-offset determining unit 107 is equal to the number of frequency-offset giving units 103-1 to 103-n. The frequency offsets are inputted to frequency-offset giving units 103-1 to 103-n, respectively. In the frequency correction circuit shown in FIG. 2, frequency-offset giving units 103-1 to 103-n are arranged at a post stage of radio receiver 102. However, frequency-offset giving units 103-1 to 103-n may control a frequency of a local transmitter in radio receiver 102.

Demodulators 104-1 to 104-n are inputted with the signals outputted from frequency-offset giving units 103-1 to 103-n, respectively, perform separation of desired user signal components from multiplexed plural user signal components, detection and selection of timing of multi-path components of the desired user signal components, i.e., path delays, channel estimation, and the like, and calculate demodulation signals. The calculated demodulation signals are outputted from demodulators 104-1 to 104-n to demodulation-signal combiners 105-1 to 105-(n−1) and to demodulation-signal selector 106.

Demodulation-signal combiners 105-1 to 105-(n−1) are inputted with demodulation signals outputted from plural demodulators among demodulators 104-1 to 104-n and combine the inputted plural demodulation signals to thereby calculate combined demodulation signals. The calculated combined demodulation signals are outputted to demodulation-signal selector 106. In the frequency correction circuit shown in FIG. 2, as an example, each of demodulation-signal combiners 105-1 to 105-(n−1) combines two demodulation signals. However, the number of demodulation signals to be combined is not limited.

Demodulation-signal selector 106 selects an optimum demodulation signal from among the demodulation signals outputted from demodulators 104-1 to 104-n and from among the combined demodulation signals outputted from demodulation-signal combiners 105-1 to 105-(n−1).

Frequency-offset determining unit 107 determines fixed frequency offsets corresponding to plural frequency errors that cover bands in which a frequency error is likely to occur. Frequency-offset determining unit 107 outputs the determined frequency offset to frequency-offset giving units 103-1 to 103-n. In the frequency correction circuit shown in FIG. 2, as an example, the number of frequency-offset giving units 103-1 to 103-n is n, i.e., the number of frequency offsets is n. However, the number of fixed frequency offsets corresponding to frequency errors is not limited.

Figure 3:
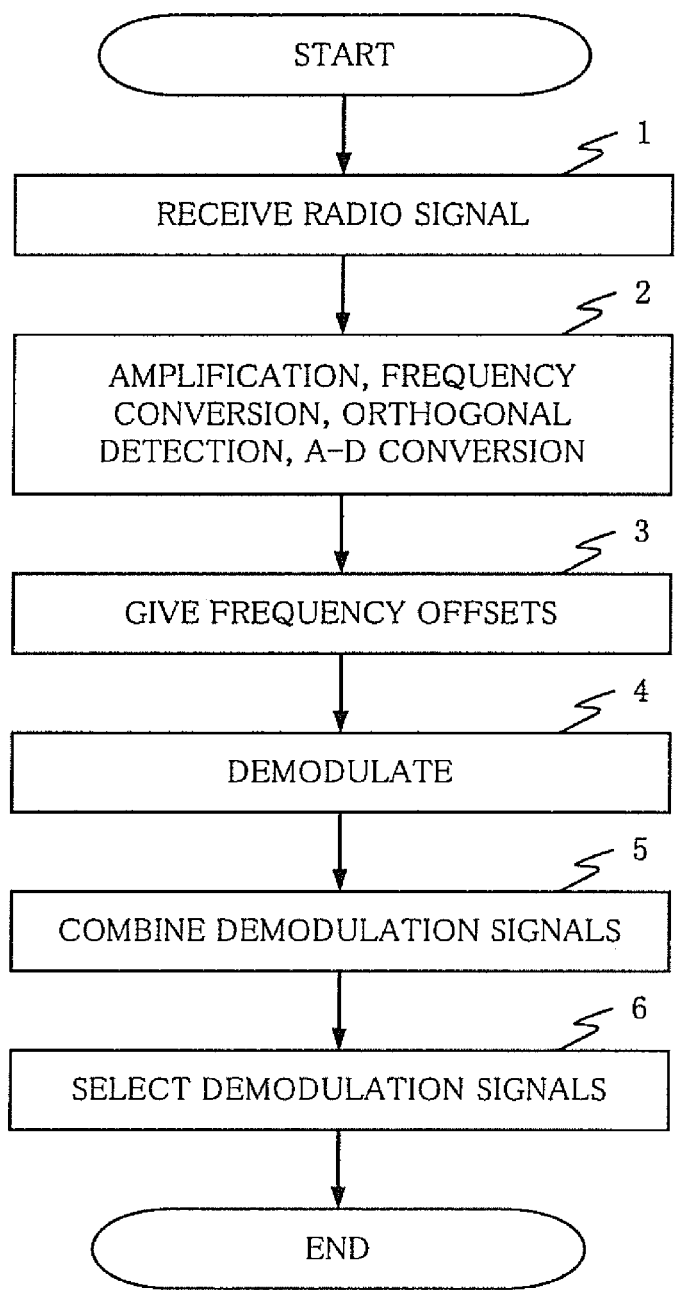
FIG. 3 is a flowchart for explaining a frequency correction method in the frequency correction circuit shown in FIG. 2.

A frequency correction method in the frequency correction circuit shown in FIG. 2 is explained below with reference to FIG. 3.

When a radio signal is received by reception antenna unit 101 in step 1, radio receiver 102 applies processing such as amplification, frequency conversion from a radio band to a base band, orthogonal detection, and A-D (analog to digital) conversion to the received radio signal in step 2.

The signal subjected to these kinds of processing is outputted from radio receiver 102 and inputted to frequency-offset giving units 103-1 to 103-*n*. Then, in step 3, frequency-offset giving units 103-1 to 103-*n* give frequency offsets to the signal. To give the frequency offsets, phase rotation processing corresponding to plural frequency offsets of a signal outputted from frequency-offset determining unit 107 is applied to respective symbols of a received digital signal in the base band, which is the signal outputted from radio receiver 102. The processing is the same as the processing in the past. The frequency offsets that are given here are determined by frequency-offset determining unit 107. Frequency-offset determining unit 107 determines fixed frequency offsets corresponding to plural frequency errors that cover bands in which a frequency error is likely to occur and outputs the determined frequency offsets to frequency-offset giving units 103-1 to 103-*n*.

Signals to which the frequency offsets are given by frequency-offset giving units 103-1 to 103-*n* are demodulated by demodulators 104-1 to 104-*n* in step 4. This demodulation processing is the same as that in the past. Demodulators 104-1 to 104-*n* perform separation of desired user signal components from multiplexed plural user signal components, detection and selection of timing of multi-path components of the desired user signal components, i.e., path delays, channel estimation, and the like, and calculate demodulation signals.

A method of separating desired user signal components from multiplexed plural user signal components, a method of detecting and selecting path delays, and the number of path delays detected and selected are not specifically limited. As an example of the method of detecting path delays, there is a method of detecting path delays using known symbols (a pilot symbol, etc.) of desired user signals. As an example of the method of selecting path delays, there is a method of selecting, in accordance with selection criteria set in advance, path delays that satisfy the selection criteria.

An example of the selection criteria is described below.

(1) Select higher-order M (M is an integer equal to or larger than 1) path delays with large desired user signal components.

(2) Select higher-order M (M is an integer equal to or larger than 1) path delays with large signal to interference ratios (SIRs) of desired user signals.

(3) Select path delays with desired user signal components larger than a threshold.

(4) Select path delays with signal to interference ratios of desired user signals larger than a threshold.

A method of estimating a radio transmission channel is not specifically limited. As an example of estimation of a radio transmission channel, there is a method of estimating a radio transmission channel using known symbols (a pilot symbol, etc.) of desired user signals.

Demodulators 104-1 to 104-*n* output demodulated signals to demodulation-signal combiners 105-1 to 105-(*n*−1) as demodulation signals.

When the demodulation signals are inputted to demodulation-signal combiners 105-1 to 105-(*n*−1), demodulation-signal combiners 105-1 to 105-(*n*−1) combine the inputted plural demodulation signals to thereby calculate combined demodulation signals, respectively, in step 5. A method of calculating combined demodulation signals is not limited. As an example of the method of calculating combined demodulation signals, there is a method of combining plural demodulation signals with close frequency offsets at a maximum ratio according to a signal to interference ratio. When calculating combined demodulation signals, a method of combining only demodulation signals with coinciding path delays using information on path delays detected and selected by demodulators 104-1 to 104-*n* may be used. When calculating combined demodulation signals, a method of combining only demodulation signals with close path delays using information on path delays detected and selected by demodulators 104-1 to 104-*n* may be used. When calculating combined demodulation signals, a method of performing correction using a correlation coefficient corresponding to a frequency offset interval may be used.

When the combined demodulation signals calculated by demodulation-signal combiners 105-1 to 105-(*n*−1) are outputted from demodulation-signal combiners 105-1 to 105-(*n*−1), the outputted combined demodulation signals are inputted to demodulation-signal selector 106.

In step 6, demodulation-signal selector 106 selects an optimum demodulation signal from among the combined demodulation signals inputted to demodulation-signal selector 106 and from among the demodulation signals outputted from demodulators 104-1 to 104-*n*. A method of selecting an optimum demodulation signal is not specifically limited. As an example of the method of selecting an optimum demodulation signal, there is a method of selecting a demodulation signal or a combined demodulation signal with the largest signal to interference ratio.

As explained above, in the present invention, fixed frequency offsets corresponding to frequency errors substantially twice as many as the number of fixed frequency-offset giving units 103-1 to 103-*n* and demodulators 104-1 to 104-*n* are prepared. Consequently, it is possible to increase the number of fixed frequency offsets corresponding to substantial frequency errors without increasing the number of fixed-frequency-offset giving units 103-1 to 103-*n* and demodulators 104-1 to 104-*n*. Demodulation-signal combiners 105-1 to 105-(*n*−1) can be realized by a circuit configuration for mainly performing addition of digital signals. Compared with frequency-offset giving units 103-1 to 103-*n* and demodulators 104-1 to 104-*n*, the circuit size of demodulation-signal combiners 105-1 to 105-(*n*−1) is small.

Therefore, according to the present invention, it is possible to accurately correct a frequency error of a received signal and prevent deterioration at the time of demodulation while controlling an increase in circuit size.

Figure 4:
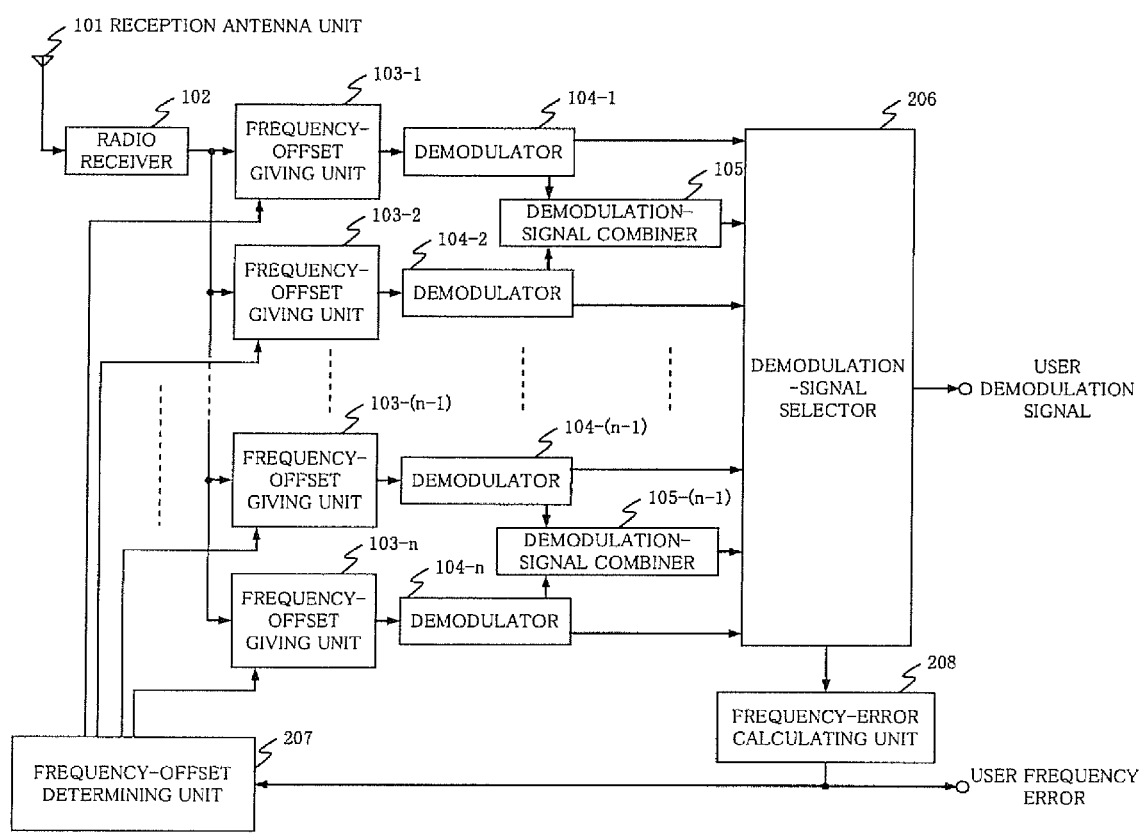
FIG. 4 is a diagram showing a frequency correction circuit according to another exemplary embodiment of the present invention.

Referring to FIG. 4, a frequency correction circuit according to another exemplary embodiment including frequency-error calculating unit 208 anew in addition to the components of the frequency correction circuit shown in FIG. 2 is shown.

Operations of reception antenna unit 101, radio receiver 102, frequency-offset giving units 103-1 to 103-*n*, demodulators 104-1 to 104-*n*, and demodulation-signal combiners 105-1 to 105-(*n*−1) are the same as the operations of the frequency correction circuit shown in FIG. 2.

Demodulation-signal selector 206 selects an optimum demodulation signal from among the demodulation signals outputted from demodulators 104-1 to 104-*n* and from among the combined demodulation signals outputted from demodulation-signal combiners 105-1 to 105-(*n*−1) and outputs information on a frequency offset corresponding to the optimum demodulation signal.

Frequency-error calculating unit 208 is inputted with the frequency offset information outputted from demodulation-signal selector 206, calculates a frequency error corresponding to the optimum demodulation signal, and outputs the calculated frequency error to frequency-offset determining unit 207. A method of calculating a frequency error corresponding to the optimum demodulation signal is not specifically limited. As an example of the method of calculating a frequency error corresponding to the optimum demodulation signal, there is a method of using the difference between a signal to interference ratio of the optimum demodulation signal and a signal to interference ratio of a demodulation signal in a frequency offset close to the optimum demodulation signal or a method of using the ratios.

For example, in adjacent two frequency offsets, when demodulation signals of the same path delay or path delays close to each other are combined at a maximum ratio according to a signal to interference ratio, assuming that the demodulation signals are combined at a ratio of about 1:1, it is highly likely that a frequency difference of the demodulation signals is a frequency error near the middle of these two frequency offsets. When demodulation signals of the same path delay are not present in adjacent frequency offsets, it is highly likely that a frequency error is a frequency offset selected as an optimum demodulation signal. As a specific example, signal to interference ratios of demodulation signals of the same path delay in adjacent two frequency offsets A and B (A<B) are SIR_A and SIR_B, respectively, and frequency offset A is selected as a frequency offset of a demodulation signal with a maximum signal to interference ratio selected as an optimum demodulation signal. In this case, (A), when SIR_B/SIR_A is equal to or smaller than 0.67, a frequency error is calculated as A and (B), when SIR_B/SIR_A is larger than 0.67 and equal to or smaller than 1, a frequency error is calculated as (A+B)/2.

Frequency-offset determining unit 207 is inputted with the frequency error outputted from frequency-error calculating unit 208 and determines fixed frequency offsets corresponding to plural frequency errors limited to those near the inputted frequency error. Frequency-offset determining unit 207 outputs the determined frequency offsets to frequency-offset giving units 103-1 to 103-*n*.

It is possible to realize convergence of the operation for correcting a frequency error in a short time by calculating a frequency error corresponding to the optimum demodulation signal and reflecting the frequency error as a frequency offset in this way.

It is possible to accurately estimate a frequency error of a received signal while controlling an increase in circuit size.

As explained above, in the present invention, even when an operation for correcting a frequency error by AFC does not converge, it is possible to accurately correct a frequency error of a received signal and prevent deterioration at the time of demodulation while controlling an increase in circuit size. This is because, after fixed frequency offsets corresponding to plural frequency errors prepared in advance are given to the received signal, demodulation is performed and an optimum demodulation signal is selected by using demodulation signals and combined demodulation signals that are obtained by combining plural demodulation signals.

As described above, the frequency correction circuit according to the present invention may include a radio receiver that receives a radio signal, a frequency-offset determining unit that determines plural frequency offsets given to the radio signal, a frequency-offset giving unit that gives the frequency offsets determined by the frequency-offset determining unit to the radio signal, a demodulator that demodulates the radio signal to which the frequency offsets are given by the frequency-offset giving unit, a demodulation-signal combiner that combines an arbitrary number of demodulation signals as combined demodulation signals from among the demodulation signals demodulated by the demodulator, and a demodulation-signal selector that selects one demodulation signal or combined demodulation signal from among the demodulation signals and the combined demodulation signals.

The frequency correction circuit may calculate frequency errors based on a frequency offset of the selected demodulation signal or combined demodulation signal and determine plural frequency offsets given to the radio signal based on the calculated frequency errors.

As described above, the frequency correction method according to the present invention may include a step of calculating frequency errors on the basis of a frequency offset of the selected demodulation signal or combined demodulation signal and a step of determining plural frequency offsets given to the radio signal based on the calculated frequency errors.

While an exemplary embodiment of the present invention has been described in specific terms, such description is for illustrative purpose only, and it is to be understood that changes and variations may be made without departing from the spirit or scope of the following claims.

What is claimed is:

1. A frequency correction circuit that gives plural frequency offsets to a received radio signal in order to correct a frequency error of the radio signal, demodulates the radio signal, and selects one demodulation signal from among demodulated plural demodulation signals, wherein
    the frequency correction circuit combines an arbitrary number of demodulation signals as combined demodulation signals from among the plural demodulation signals and selects one demodulation signal or combined demodulation signal from among the demodulation signals and the combined demodulation signals.

2. The frequency correction circuit according to claim 1, wherein
    the frequency correction circuit includes:
    a radio receiver that receives a radio signal;
    a frequency-offset determining unit that determines plural frequency offsets given to the radio signal;
    a frequency-offset giving unit that gives the frequency offsets determined by the frequency-offset determining unit to the radio signal;
    a demodulator that demodulates the radio signal to which the frequency offsets are given by the frequency-offset giving unit;
    a demodulation-signal combiner that combines an arbitrary number of demodulation signals as combined demodulation signals from among the demodulation signals demodulated by the demodulator; and
    a demodulation-signal selector that selects one demodulation signal or combined demodulation signal from among the demodulation signals and the combined demodulation signals.

3. The frequency correction circuit according to claim 1, wherein the frequency correction circuit calculates frequency errors based on a frequency offset of the selected demodulation signal or combined demodulation signal and determines plural frequency offsets given to the radio signal based on the calculated frequency errors.

4. A method of correcting a frequency error of a received radio signal, comprising:
    a step of determining plural frequency offsets given to the radio signal;
    a step of giving the determined frequency offsets to the radio signal;
    a step of demodulating the radio signal to which the frequency offsets are given;
    a step of combining an arbitrary number of demodulation signals as combined demodulation signals from among demodulated demodulation signals; and a step of selecting one demodulation signal or combined demodulation signal from among the demodulation signals and the combined demodulation signals.

5. The method according to claim 4, further comprising:
a step of calculating frequency errors based on a frequency offset of the selected demodulation signal or combined demodulation signal; and a step of determining plural frequency offsets given to the radio signal on the basis of the calculated frequency errors.

* * * * *